US012211905B2

United States Patent
Su

(10) Patent No.: US 12,211,905 B2
(45) Date of Patent: Jan. 28, 2025

(54) METHOD FOR PREPARING RECESSED GATE STRUCTURE WITH PROTECTION LAYER

(71) Applicant: NANYA TECHNOLOGY CORPORATION, New Taipei (TW)

(72) Inventor: Kuo-Hui Su, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 334 days.

(21) Appl. No.: 17/672,138

(22) Filed: Feb. 15, 2022

(65) Prior Publication Data
US 2023/0261061 A1  Aug. 17, 2023

(51) Int. Cl.
| H01L 29/40 | (2006.01) |
| H01L 21/768 | (2006.01) |
| H01L 23/528 | (2006.01) |
| H01L 23/532 | (2006.01) |
| H01L 29/423 | (2006.01) |
| H01L 29/51 | (2006.01) |

(52) U.S. Cl.
CPC ...... *H01L 29/401* (2013.01); *H01L 21/76846* (2013.01); *H01L 21/76858* (2013.01); *H01L 21/76867* (2013.01); *H01L 23/5283* (2013.01); *H01L 23/53238* (2013.01); *H01L 29/4236* (2013.01); *H01L 29/513* (2013.01); *H01L 29/518* (2013.01)

(58) Field of Classification Search
None
See application file for complete search history.

(56) References Cited

U.S. PATENT DOCUMENTS

| 2004/0266030 A1* | 12/2004 | Kweon | H01L 29/40111 |
| | | | 438/240 |
| 2007/0210350 A1 | 9/2007 | Omura et al. | |
| 2008/0020542 A1 | 1/2008 | Maynollo | |
| 2014/0239419 A1* | 8/2014 | Chen | H01L 29/401 |
| | | | 257/411 |
| 2016/0042954 A1 | 2/2016 | Sung et al. | |
| 2017/0040220 A1 | 2/2017 | Kim et al. | |
| 2018/0261515 A1* | 9/2018 | Wang | H01L 21/324 |
| 2020/0135475 A1* | 4/2020 | Cheng | H01L 21/823842 |
| 2021/0028286 A1 | 1/2021 | An et al. | |

(Continued)

FOREIGN PATENT DOCUMENTS

| TW | I750032 B | 12/2021 |
| TW | I751635 B | 1/2022 |

OTHER PUBLICATIONS

Office Action dated Oct. 27, 2023, U.S. Appl. No. 17/671,830.

*Primary Examiner* — Alexander G Ghyka
(74) *Attorney, Agent, or Firm* — MUNCY, GEISSLER, OLDS & LOWE, P.C.

(57) ABSTRACT

A method for preparing a recessed gate structure includes forming a recessed structure, wherein the recessed structure comprises a substrate with the recess extending into the substrate from a topmost surface of the substrate; forming a first functional layer to at least cover a sidewall of a recess of the recessed structure; forming a second functional layer to cover the first functional layer; performing a rapid thermal treatment to form an interfacial layer extending along an interface between the first functional layer and the second functional layer; and forming a conductive feature to fill up the recess.

17 Claims, 16 Drawing Sheets

(56) References Cited

U.S. PATENT DOCUMENTS

| | | |
|---|---|---|
| 2021/0035989 A1 | 2/2021 | Lee et al. |
| 2021/0082918 A1 | 3/2021 | Cheng et al. |
| 2021/0408229 A1 | 12/2021 | More et al. |
| 2022/0181459 A1 | 6/2022 | Cho et al. |
| 2022/0238688 A1 | 7/2022 | Lee et al. |

* cited by examiner

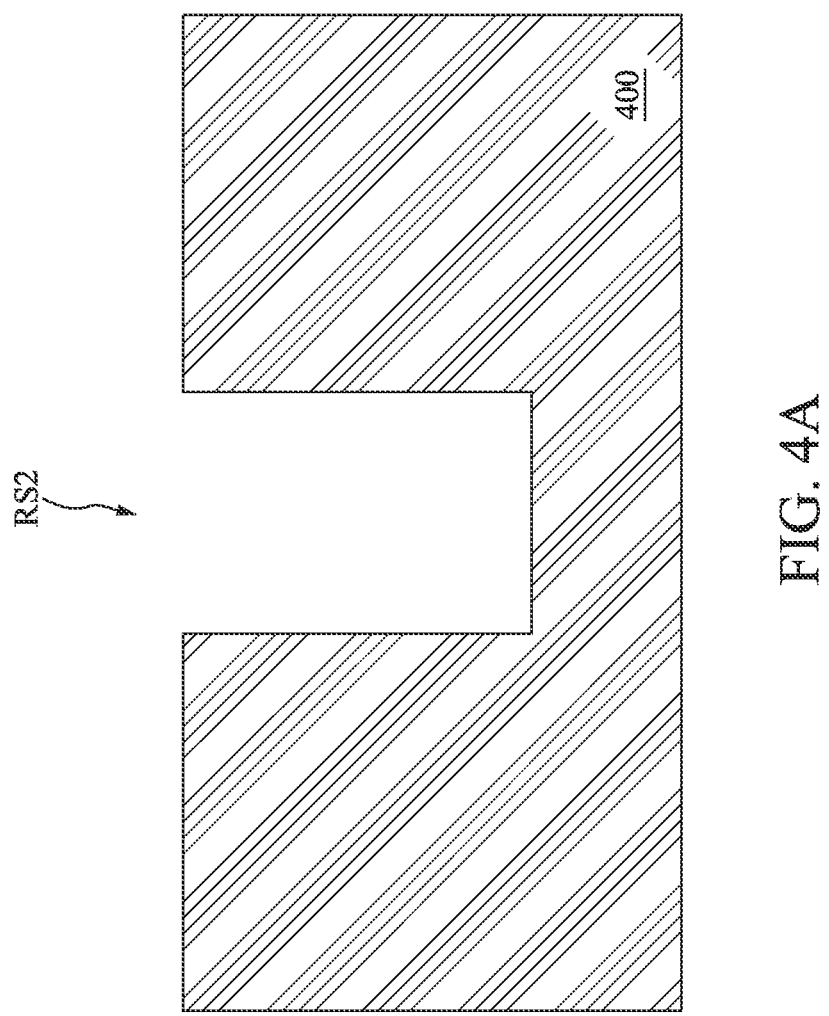

METHOD FOR PREPARING RECESSED GATE STRUCTURE WITH PROTECTION LAYER

TECHNICAL FIELD

The present disclosure relates to a method for preparing a recessed gate structure, and more particularly, to a method for preparing a recessed gate structure with a protection layer.

DISCUSSION OF THE BACKGROUND

Conductive features are formed in a semiconductor device for transmitting signals. Some of the conductive features are filled in recesses, such as contact holes in dielectric layers and trenches in a substrate. In addition, functional layers may be formed in the recesses as well. The functional layers separate the conductive features in the recesses from surrounding structures, and may provide additional functionalities. For instance, the functional layers may include barrier layers, adhesion layers, gate dielectric layers and so forth.

As continuously scaling of the semiconductor device, the recesses accommodating the conductive features become smaller in size. As a result, aspect ratio of the recesses is increased. Consequently, it has become harder for forming the functional layers in the recesses while maintaining low thickness and great conformity of the functional layers in leading generations.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a semiconductor device is provided. The semiconductor device comprises: a recessed structure; a conductive feature, filled in a recess of the recessed structure; a first functional layer, extending between the conductive feature and the recessed structure, and comprising a first element; a second functional layer, extending between the first functional layer and the conductive feature, and comprising a second element; and an interfacial layer, extending along an interface between the first functional layer and the second functional layer, and comprising the first element and the second element.

In another aspect of the present disclosure, a manufacturing method of the semiconductor device is provided. The method comprises: forming a recessed structure; forming a first functional layer to at least cover a sidewall of a recess of the recessed structure; forming a second functional layer to cover the first functional layer; performing a rapid thermal treatment, to form an interfacial layer extending along an interface between the first functional layer and the second functional layer; and forming a conductive feature to fill up the recess.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 4A through FIG. 4F are schematic cross-sectional views illustrating structures at various stages during the manufacturing process shown in FIG. 3.

DETAILED DESCRIPTION

Figure 1:
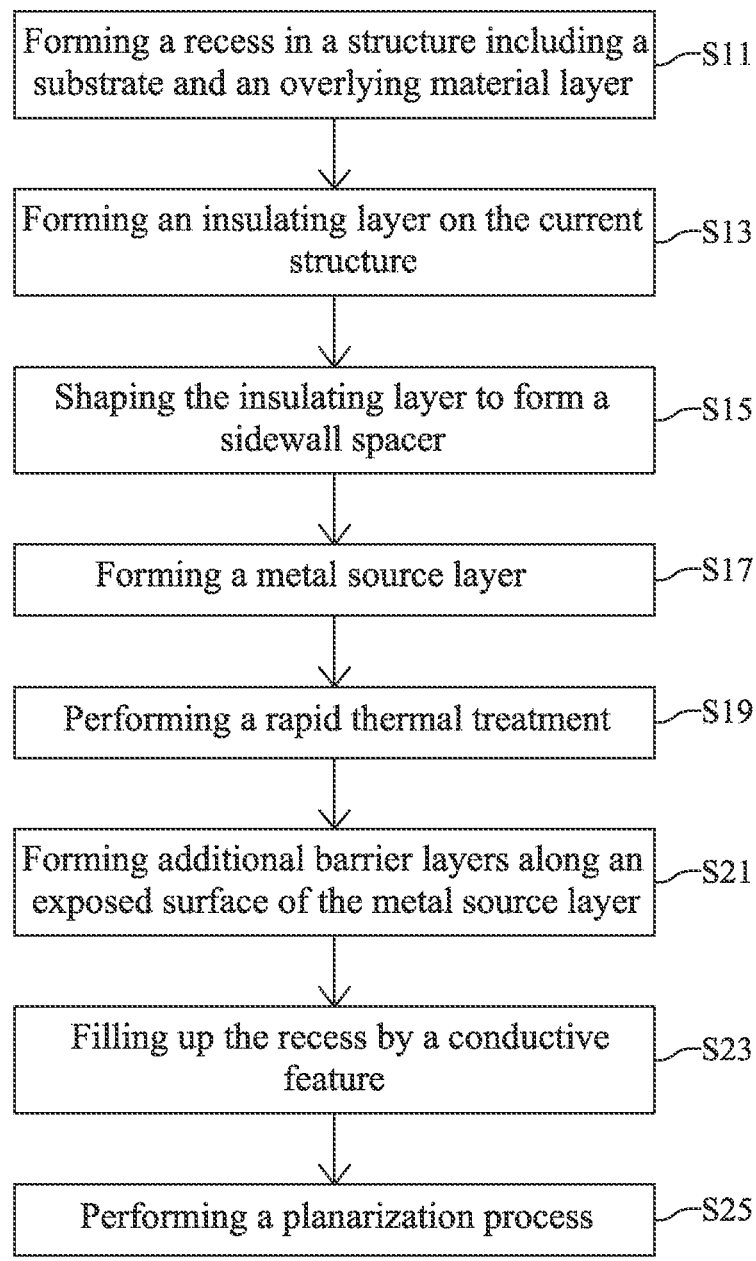
FIG. 1 is a flow diagram illustrating a method for preparing a semiconductor structure according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

The present disclosure provides a method for preparing a conductive feature and conformal functional layers in a recess during manufacturing of a semiconductor device. As an example, the semiconductor device may be an electronic memory (e.g., a dynamic random access memory (DRAM)), but the present disclosure is not limited to types of the semiconductor device.

FIG. 1 is a flow diagram illustrating a method 10 for preparing a semiconductor structure 100A such as a contact structure in a material layer, according to some embodiments of the present disclosure. FIG. 2A through FIG. 2H are schematic cross-sectional views illustrating structures at various stages during the manufacturing process shown in FIG. 1.

Figure 2A:
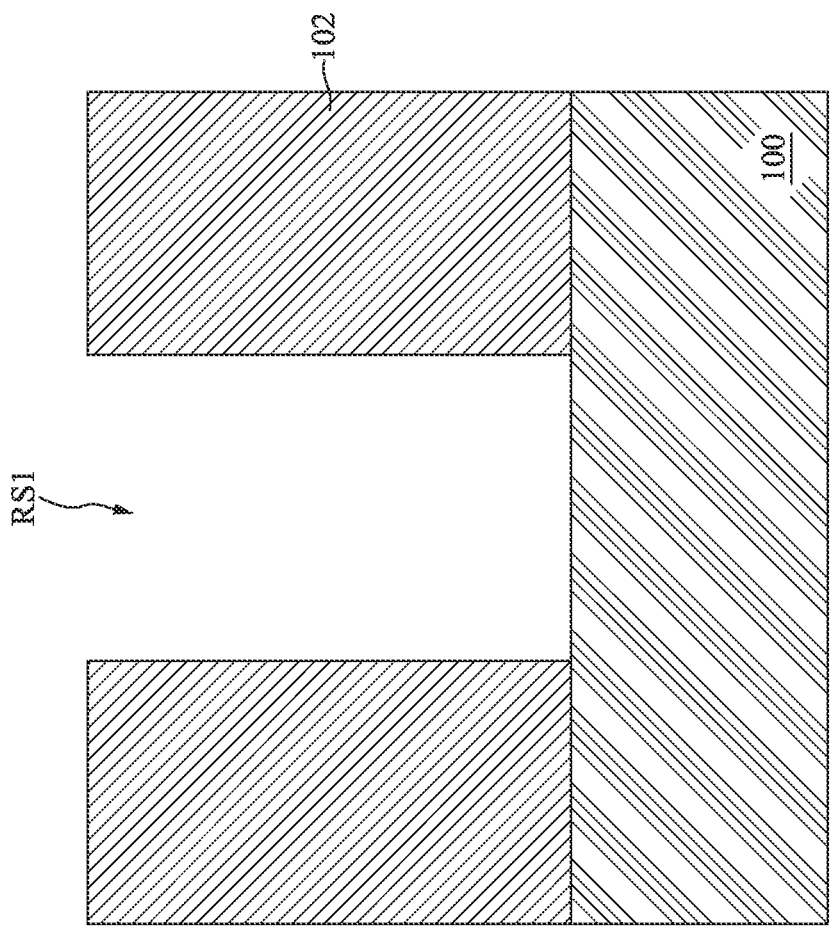
FIG. 2A through FIG. 2H are schematic cross-sectional views illustrating structures at various stages during the manufacturing process shown in FIG. 1.

Referring to FIG. 1 and FIG. 2A, step S11 is performed, and a recess RS1 is formed. In some embodiments, the recess RS1 is defined by a substrate 100 and an overlying material layer 102 with a through hole. The substrate 100 may be a semiconductor wafer, while the material layer 102 may be a dielectric layer formed on the semiconductor wafer. According to some embodiments, the substrate 100 is a silicon wafer, and the material layer 102 may be a silicon oxide layer. A method for preparing the recess RS1 may include forming a mask pattern with an opening (not shown) on the material layer 102. Subsequently, an etching process (e.g., an anisotropic etching process) may be performed on the material layer 102 by using the mask pattern as a shadow mask, to etch through the material layer 102. Consequently, the material layer 102 with a through hole and the underlying substrate 100 define the recess RS1. Thereafter, the mask pattern is removed.

Figure 2B:
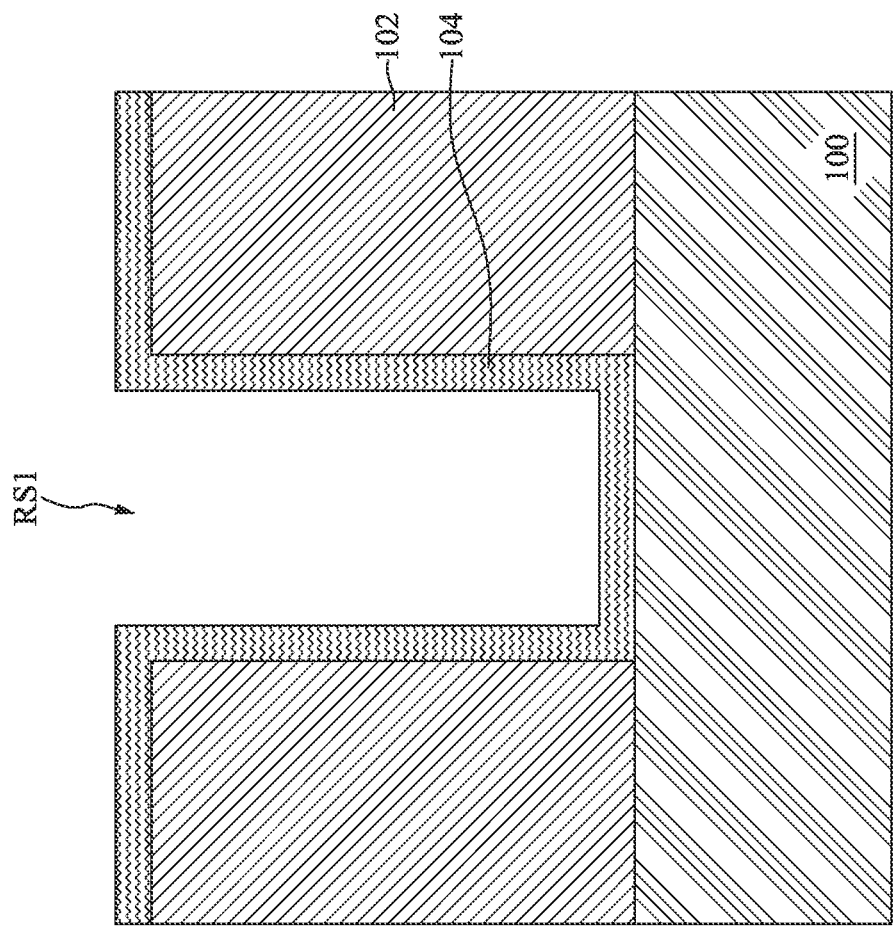

Referring to FIG. 1 and FIG. 2B, step S13 is performed, and an insulating layer 104 is conformally formed on the current structure. In other words, the insulating layer 104 extends along a top surface of the material layer 102, and lines along a sidewall and a bottom surface of the recess RS1. In some embodiments, the insulating layer 104 is formed of silicon nitride. A method for preparing the insulating layer 104 may include a deposition process, such as a chemical vapor deposition (CVD) process.

Figure 2C:
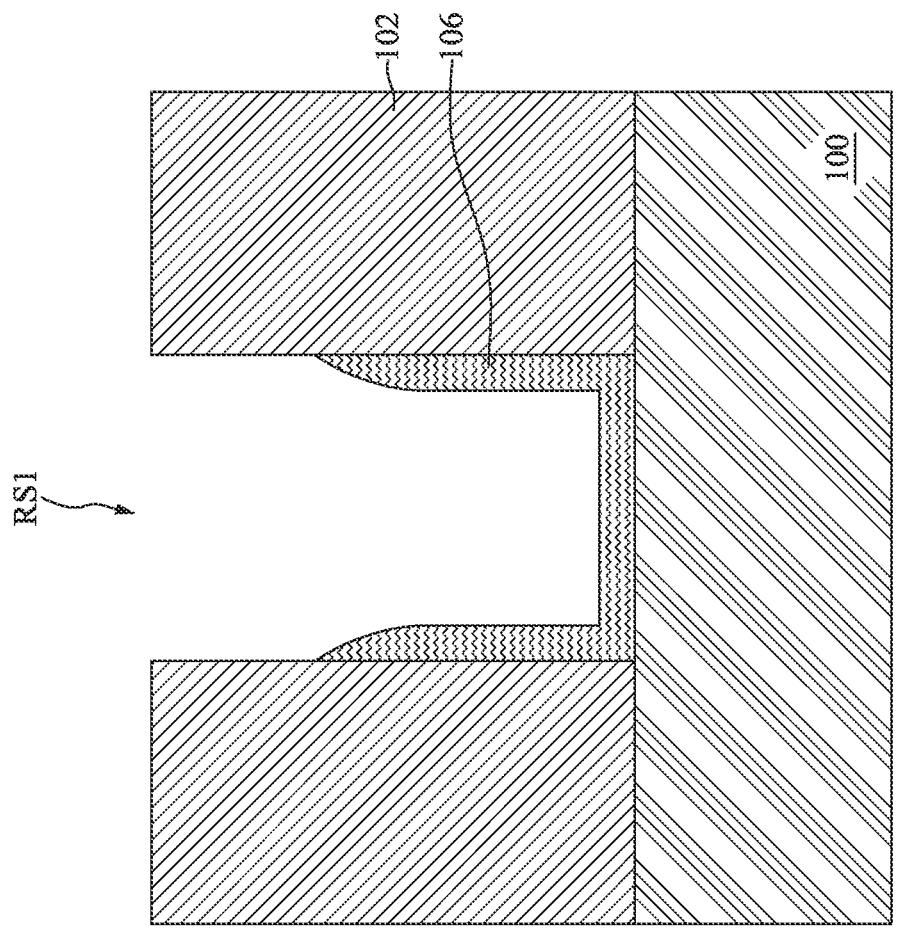

Referring to FIG. 1 and FIG. 2C, step S15 is performed, and the insulating layer 104 is shaped to form a sidewall spacer 106. The sidewall spacer 106 extends along the sidewall of the recess RS1 from the bottom surface of the recess RS1 to a height lower than the top surface of the material layer 102. According to some embodiments, a thickness of a top portion of the sidewall spacer 106 gradually decreases toward a top end of the sidewall spacer 106. A method for shaping the insulating layer 104 for forming the sidewall spacer 106 may include performing an anisotropic etching process on the insulating layer 104 without using a mask pattern. During the anisotropic etching process, portions of the insulating layer 104 exposed to etchant at greater grazing angle may be removed, while other portions of the insulating layer 104 less exposed to the etchant may remain, and the remaining portions of the insulating layer 104 become the sidewall spacer 106. Since the sidewall spacer 106 is formed without using a lithography process, the formation of the sidewall spacer 106 may be referred to as a self-aligned patterning process.

Figure 2D:
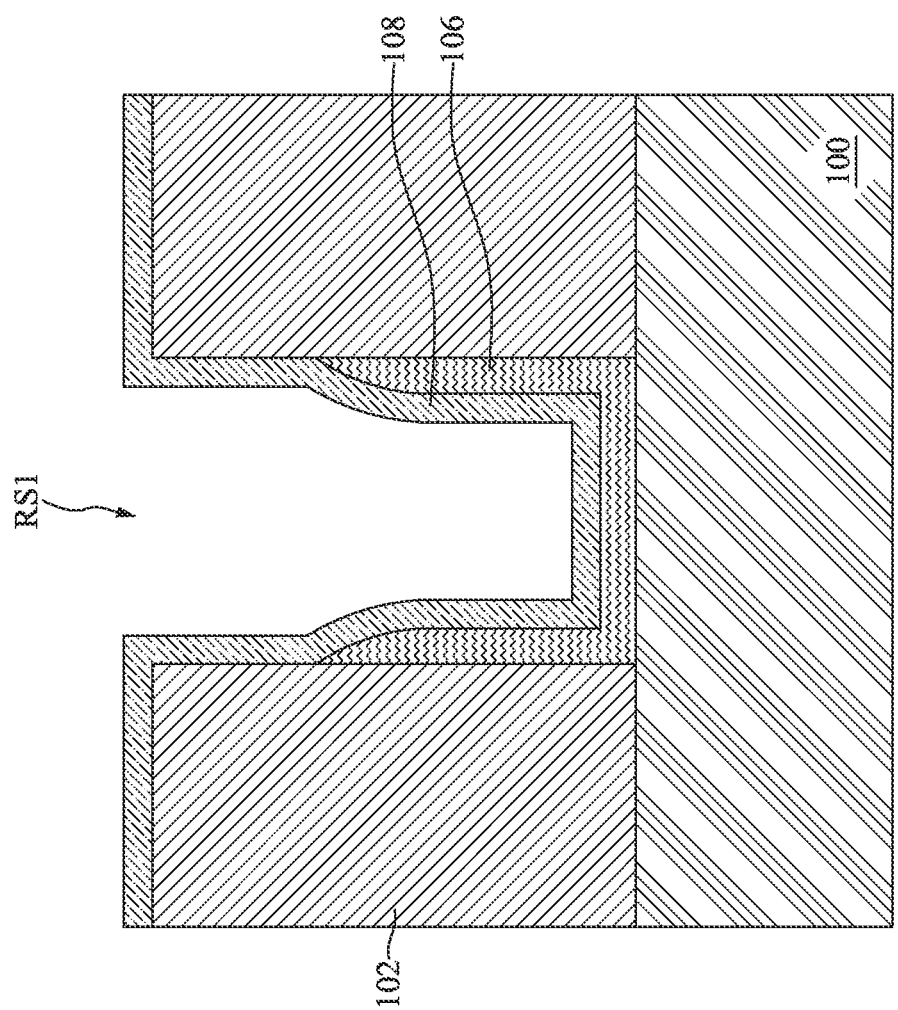

Referring to FIG. 1 and FIG. 2D, step S17 is performed, and an adhesion layer 108 is formed on the current structure. The adhesion layer 108 may be functioned for improving adhesion between elements to be further filled in the recess RS1 and the surrounding sidewall spacer 106, material layer 102 and substrate 100. In addition, the adhesion layer 108 may provide metal content for a barrier layer to be formed at an interface between the adhesion layer 108 and the sidewall spacer 106 during a subsequent thermal treatment. According to some embodiments, the adhesion layer 108 conformally covers the sidewall spacer 106 as well as exposed portions of the material layer 102 and the substrate 100. The adhesion layer 108 is formed of a metallic layer. In some embodiments, the adhesion layer 108 is a titanium layer, and a method for preparing the adhesion layer 108 may include a deposition process, such as a CVD process.

Figure 2E:
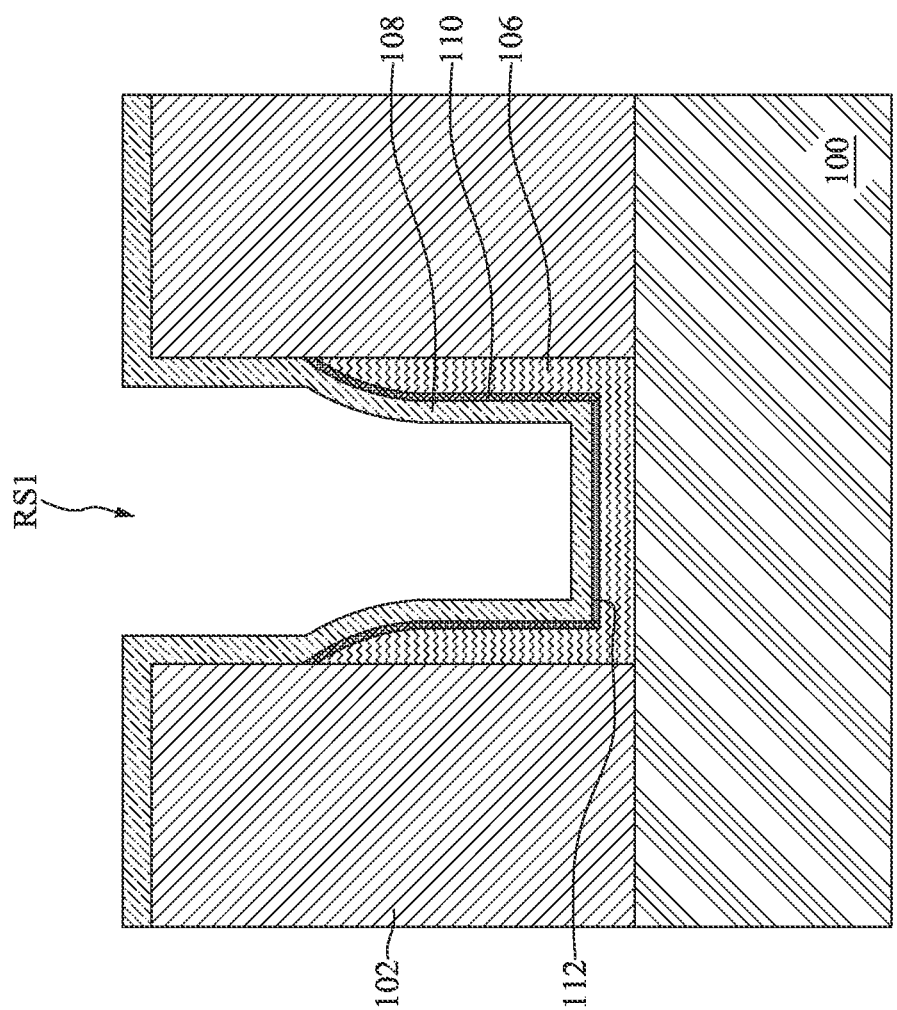

Referring to FIG. 1 and FIG. 2E, step S19 is performed, and a rapid thermal treatment is performed on the current structure. During the rapid thermal treatment, contents in the sidewall spacer 106 and metal contents in a thin portion of the adhesion layer 108 in contact with the sidewall spacer 106 may diffuse across an interface therebetween. Reaction may take place at the inter-diffusion region, such that an interfacial layer 110 is formed along the interface between the sidewall spacer 106 and the adhesion layer 108. Since the interfacial layer 110 is formed by the inter-diffusion and reaction at the interface between the sidewall spacer 106 and the adhesion layer 108, the interfacial layer 110 shows great conformity along such interface. Moreover, a thickness of the interfacial layer 110 can be controlled by a process time and a process temperature of the rapid thermal treatment. In some embodiments, the thickness of the interfacial layer 110 is less than a thickness of the remained adhesion layer 108.

In those embodiments where the sidewall spacer 106 is formed of silicon nitride and the adhesion layer 108 is formed of titanium, silicon and nitrogen in the sidewall spacer 106 and titanium in the adhesion layer 108 may diffuse across the interface therebetween and establish chemical bonding among titanium, silicon and nitrogen, to form the interfacial layer 110 of titanium silicon nitride (TiSiN) showing improved barrier performance over titanium nitride barrier layer. In these embodiments, the rapid thermal treatment for forming the TiSiN interfacial layer 110 may be referred to as a rapid thermal nitridation (RTN) process.

According to some embodiments, an interfacial layer 112 is also formed during the rapid thermal treatment. The interfacial layer 112 extends along an interface between the adhesion layer 108 and the substrate 100, and may be in lateral contact with the interfacial layer 110. During the rapid thermal treatment, contents in the substrate 100 and metal contents in the adhesion layer 108 may diffuse across the interface between the substrate 100 and the adhesion layer 108, and react to form the interfacial layer 112. As similar to the interfacial layer 110, the interfacial layer 112 can exhibit great conformity, and a thickness of the interfacial layer 112 can be controlled by a process time and a process temperature of the rapid thermal treatment. According to some embodiments, the thickness of the interfacial layer 112 is less than the thickness of the remained adhesion layer 108.

In those embodiments where the adhesion layer 108 is formed of titanium and the substrate 100 is a silicon substrate, titanium in the adhesion layer 108 and silicon in the substrate 100 may inter-diffuse, and chemical bonding between titanium and silicon is established, such that the interfacial layer 112 of titanium silicide (TiSi$_x$) showing improved conductivity over the silicon substrate 100 may be formed.

Figure 2F:
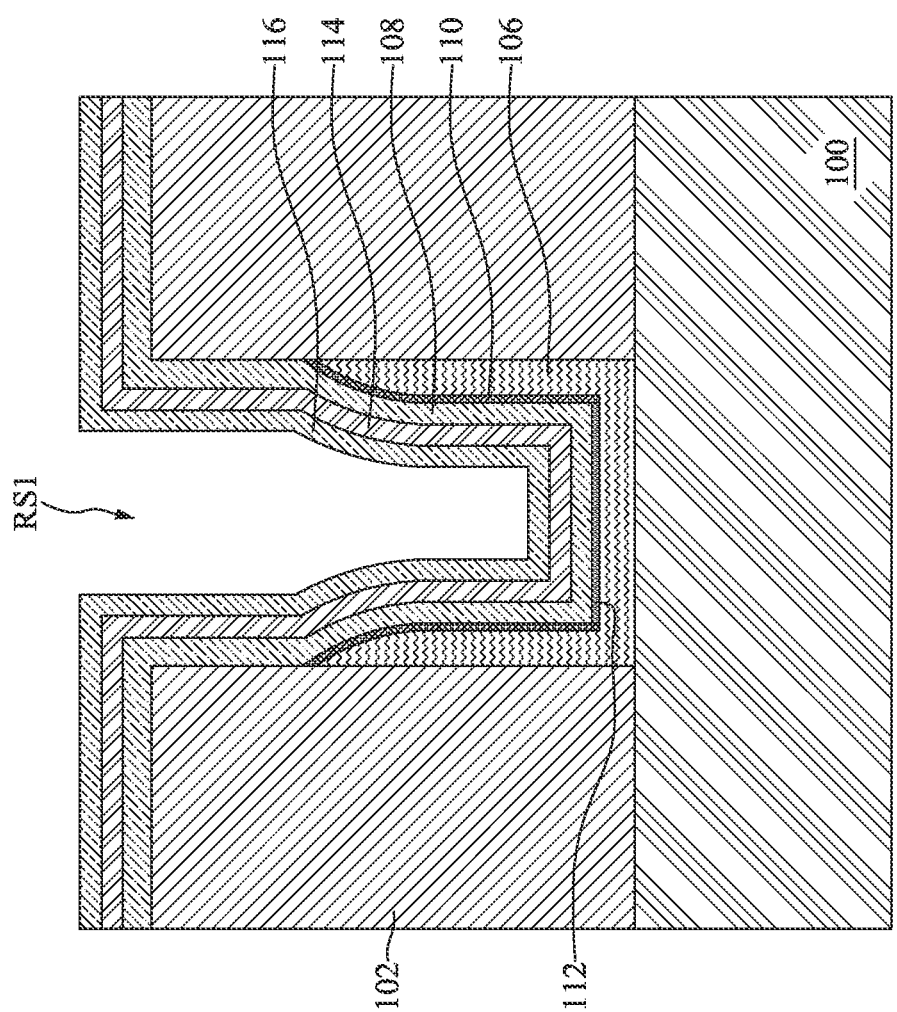

Referring to FIG. 1 and FIG. 2F, step S21 is performed, and barrier layers 114, 116 are formed along an exposed surface of the adhesion layer 108. The barrier layers 114, 116 may be sequentially formed, such that the barrier layer 114 extends between the adhesion layer 108 and the barrier layer 116. In addition, the barrier layers 114, 116 may conformally cover the underlying structure. In some embodiments, the barrier layer 114 is formed of tantalum, and the barrier layer 116 is formed of tantalum nitride (TaN). A method for preparing each of the barrier layers 114, 116 may include a deposition process, such as a physical vapor deposition (PVD) process or a CVD process.

Figure 2G:
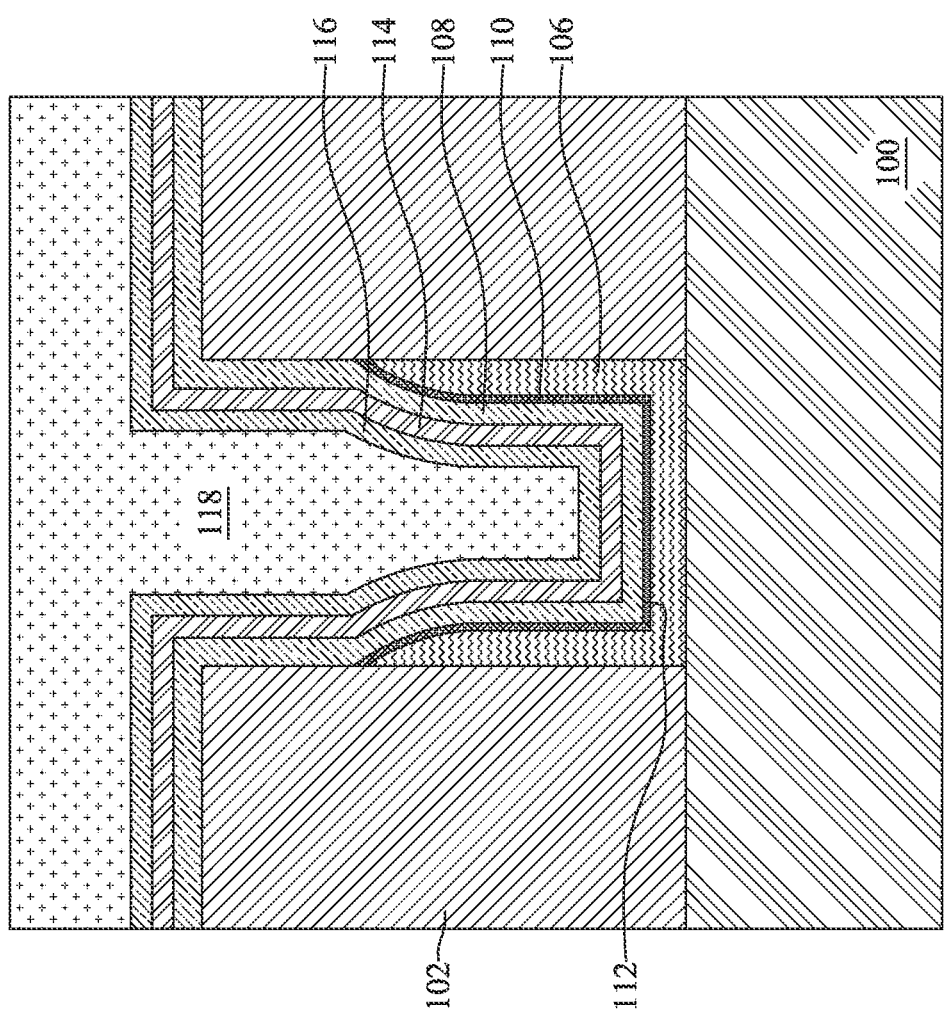

Referring to FIG. 1 and FIG. 2G, step S23 is performed, and the recess RS1 is filled up by a conductive feature 118. According to some embodiments, the conductive feature 118 further extends onto the material layer 102, and may lie on the barrier layers 114, 116. As an example, the conductive feature 118 may include copper. In some embodiments, a method for preparing the conductive feature 118 includes a deposition process (e.g., a PVD process) and a following plating process. In these embodiments, a seed layer (not shown) formed by the deposition process may extend along a bottom surface of the conductive feature 118.

Figure 2H:
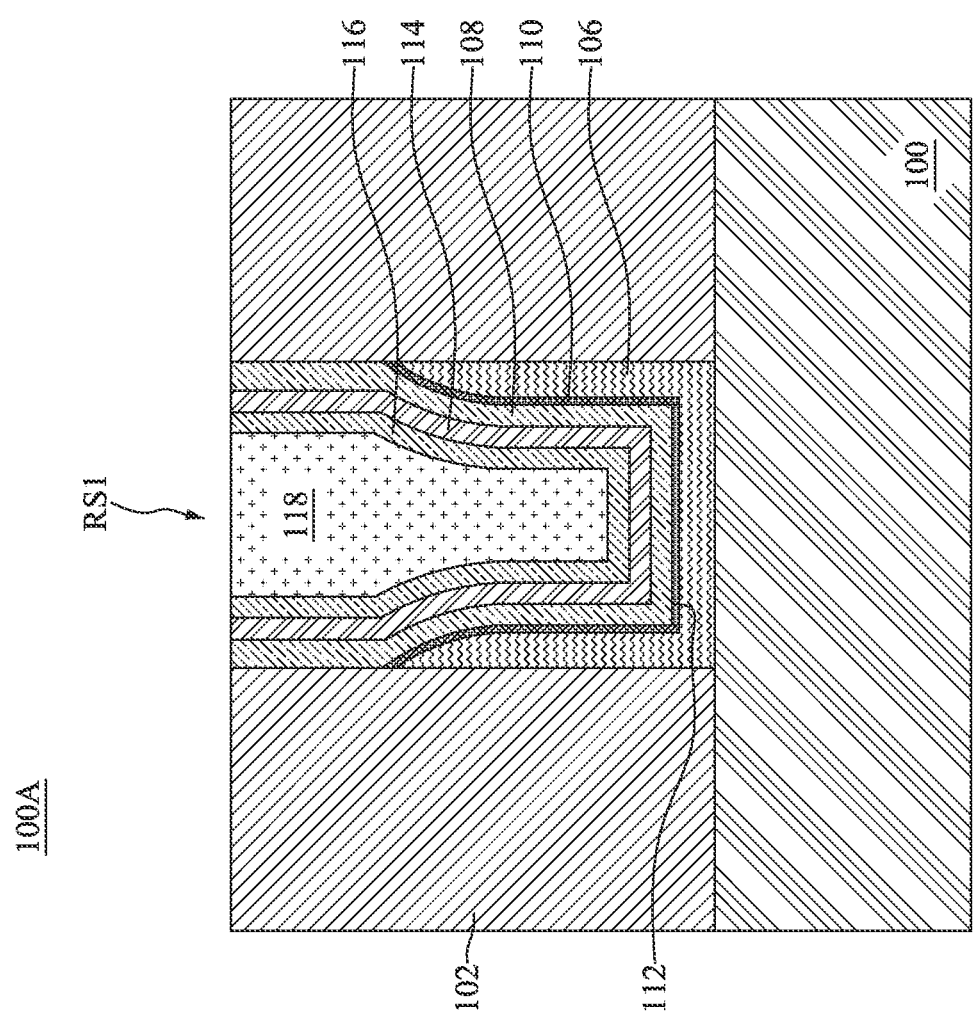

Referring to FIG. 1 and FIG. 2H, step S25 is performed, and a planarization process may be performed. During the planarization process, portions of the conductive feature 118 and adhesion layer 108 above the material layer 102 may be removed. Remained portions of the conductive feature 118 and adhesion layer 108 may have top surfaces substantially coplanar with a top surface of the material layer 102. In those embodiments where the additional barrier layers 114, 116 are disposed between the conductive feature 118 and the adhesion layer 108, portions of the adhesion layer 108 above the material layer 102 may also be removed during the planarization process, and the remained portions of the barrier layers 114, 116 may have top surfaces substantially coplanar with the top surface of the material layer 102 as well. As examples, the planarization process may include a polishing process, and etching process or a combination thereof.

So far, the conductive feature 118 is formed in the recess RS1 defined by the substrate 100 and the overlying material layer 102 with a through hole, along with multiple functional layers lining along a bottom surface and a sidewall of the conductive feature 118. These functional layers include the sidewall spacer 106, the adhesion layer 108 and the interfacial layer 110 extending between the sidewall spacer 106 and the adhesion layer 108. Since the interfacial layer 110 is formed as a result of inter-diffusion across the interface between the sidewall spacer 106 and the adhesion layer 108, the interfacial layer 110 shows great conformity along such interface. Further, a thickness of the interfacial layer 110 can be well controlled by adjusting process time and process temperature of the rapid thermal treatment resulting in the inter-diffusion.

In some embodiments, the functional layers further include the interfacial layer 112 extending along an interface between the substrate 100 and the adhesion layer 108. In addition, in some embodiments, the functional layers further include the barrier layers 114, 116 extending between the adhesion layer 108 and the conductive feature 118.

According to some embodiments, the conductive feature 118 as well as the surrounding functional layers are collectively functioned as a contact plug. A terminal of a transistor (e.g., a source/drain terminal) may be formed in the substrate 100, and the contact plug formed by the conductive feature 118 and the surrounding functional layers may be used for connecting the terminal of the transistor to an overlying signal line or a storage capacitor. However, the conductive feature 118 and the surrounding functional layers may have more applications, depending on what kind of component to be picked up. As another example, the substrate 100 may be a dielectric layer with a conductive line formed therein, and the conductive feature 118 as well as the surrounding functional layers may be configured as a contact via connecting the underlying conductive line to another conductive line lying above.

Similar manufacturing process may be used for forming another conductive feature and surrounding functional layers in a recessed structure during manufacturing of a semiconductor device.

Figure 3:
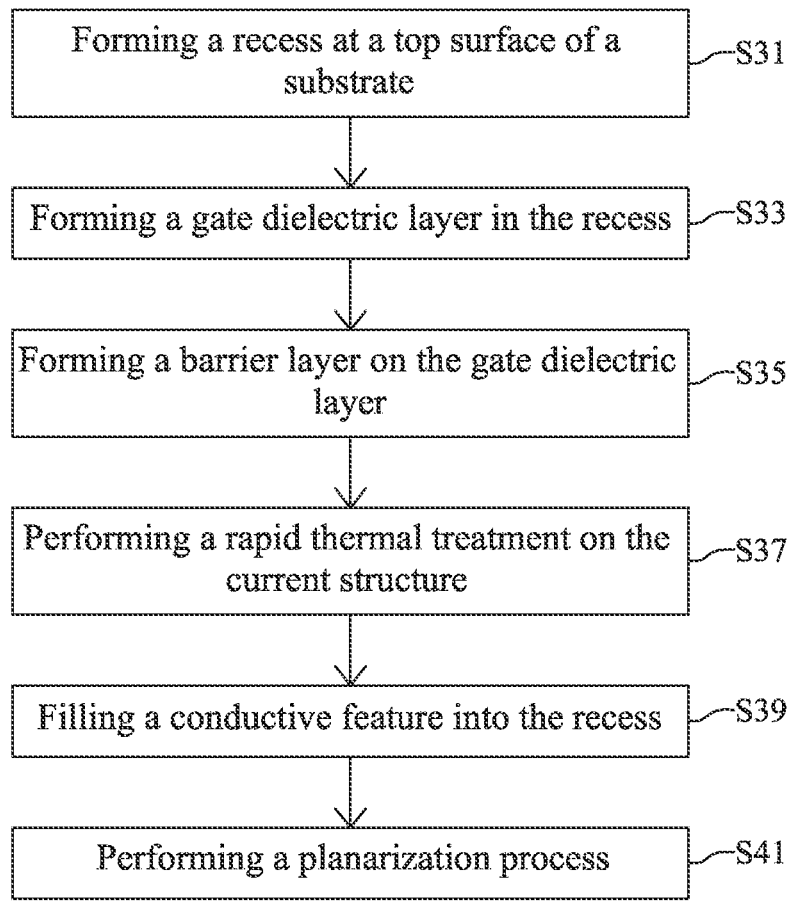
FIG. 3 is a flow diagram illustrating a method for preparing a semiconductor structure according to some embodiments of the present disclosure.

FIG. 3 is a flow diagram illustrating a method 30 for preparing a semiconductor structure 100B such as a recessed gate structure according to some embodiments of the present disclosure. FIG. 4A through FIG. 4F are schematic cross-sectional views illustrating structures at various stages during the manufacturing process shown in FIG. 3.

Referring to FIG. 3 and FIG. 4A, step S31 is performed, and a recess RS2 is formed at a top surface of a substrate 400. The substrate 400 may be a semiconductor wafer. The recess RS2 extends into the substrate 400 from the top surface of the substrate 400. According to some embodiments, the recess RS2 is a trench laterally extending in the substrate 400. A method for preparing the recess RS2 may include forming a mask pattern with an opening (not shown) on the substrate 400. Subsequently, an etching process (e.g., an anisotropic etching process) may be performed on the substrate 400 by using the mask pattern as a shadow mask, to etch into the substrate 400. Consequently, the substrate 400 is recessed, and the recess RS2 is formed. Thereafter, the mask pattern is removed.

Figure 4B:
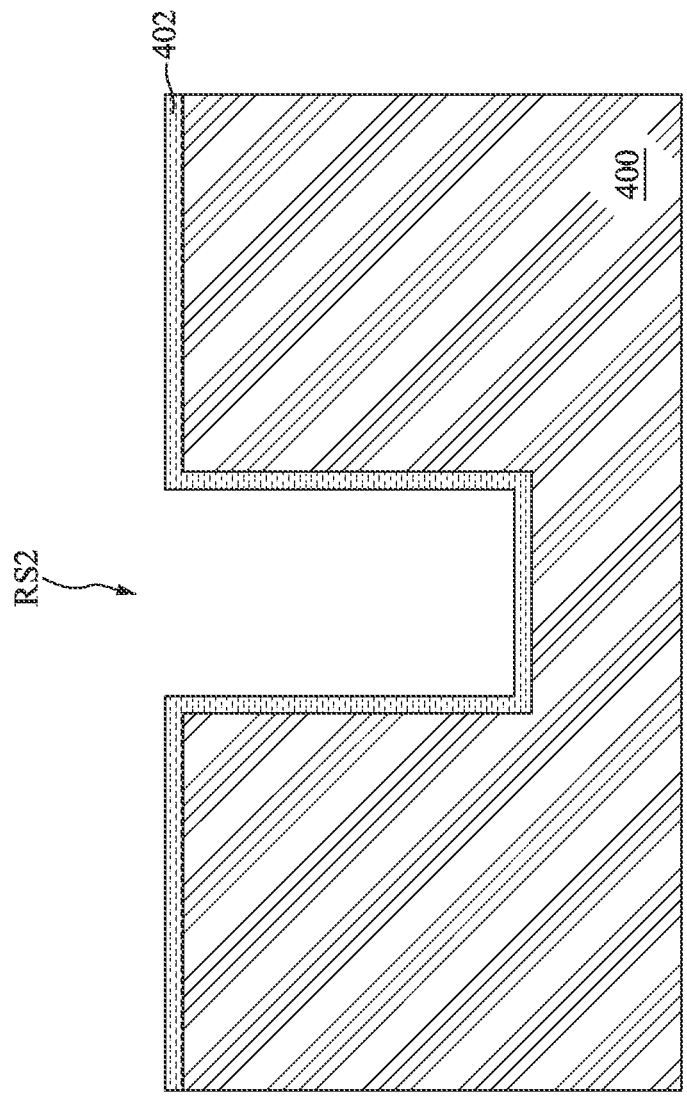

Referring to FIG. 3 and FIG. 4B, step S33 is performed, and a dielectric layer 402 is formed in the recess RS2. The recess RS2 is conformally covered by the dielectric layer 402. According to some embodiments, the dielectric layer 402 further extends onto a topmost surface of the substrate 400. The dielectric layer 402 is formed of a dielectric material, such as silicon oxide. As examples, the dielectric layer 402 is formed by a thermal oxidation process, a deposition process (e.g., a CVD process) or the like.

Figure 4C:
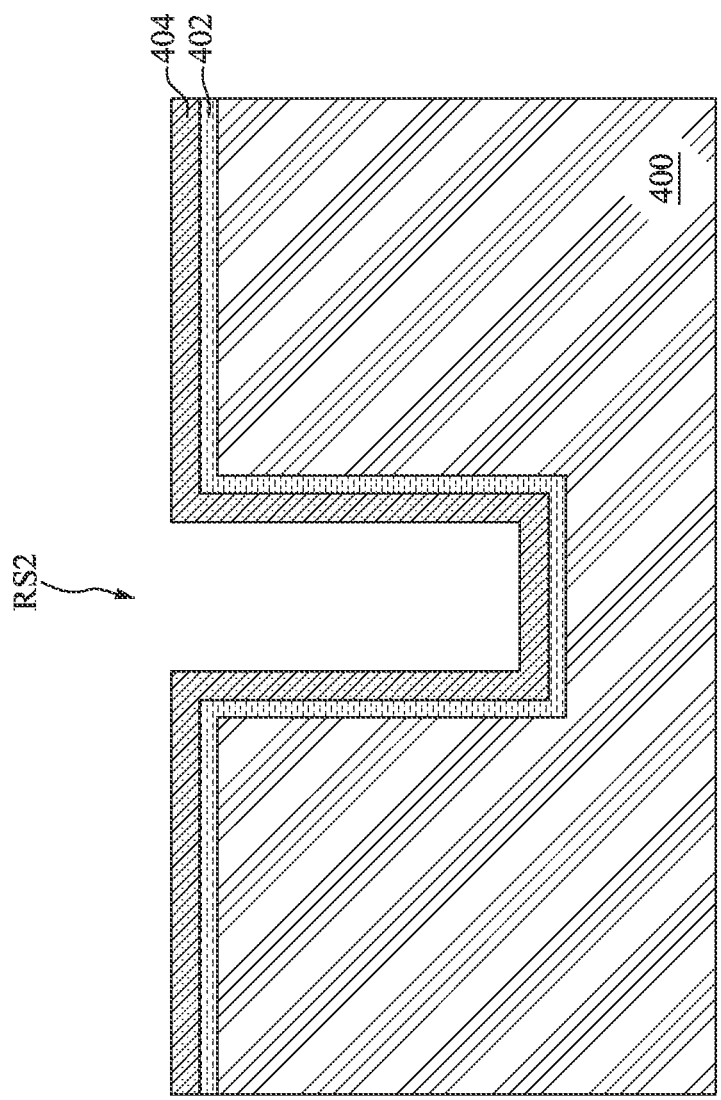

Referring to FIG. 3 and FIG. 4C, step S35 is performed, and a barrier layer 404 is formed on the dielectric layer 402. The barrier layer 404 may be block out-diffusion of a conductive feature to be filled in the recess RS2. Further, a thin portion of the barrier layer 404 in contact with the dielectric layer 402 may turn into an interfacial layer during a subsequent thermal treatment. In some embodiments, the barrier layer 404 conformally extends along sidewalls and a bottom surface of the recess RS2. Further, in some embodiments, the barrier layer 404 further extends over the topmost surface of the substrate 400. In those embodiments where the topmost surface of the substrate 400 is covered by the dielectric layer 402 and the barrier layer 404, portions of the barrier layer 404 lying along the topmost surface of the substrate 400 may be separated from the substrate 400 by the dielectric layer 402. A method for preparing the barrier layer 404 may include a deposition process, such as a CVD process.

Figure 4D:
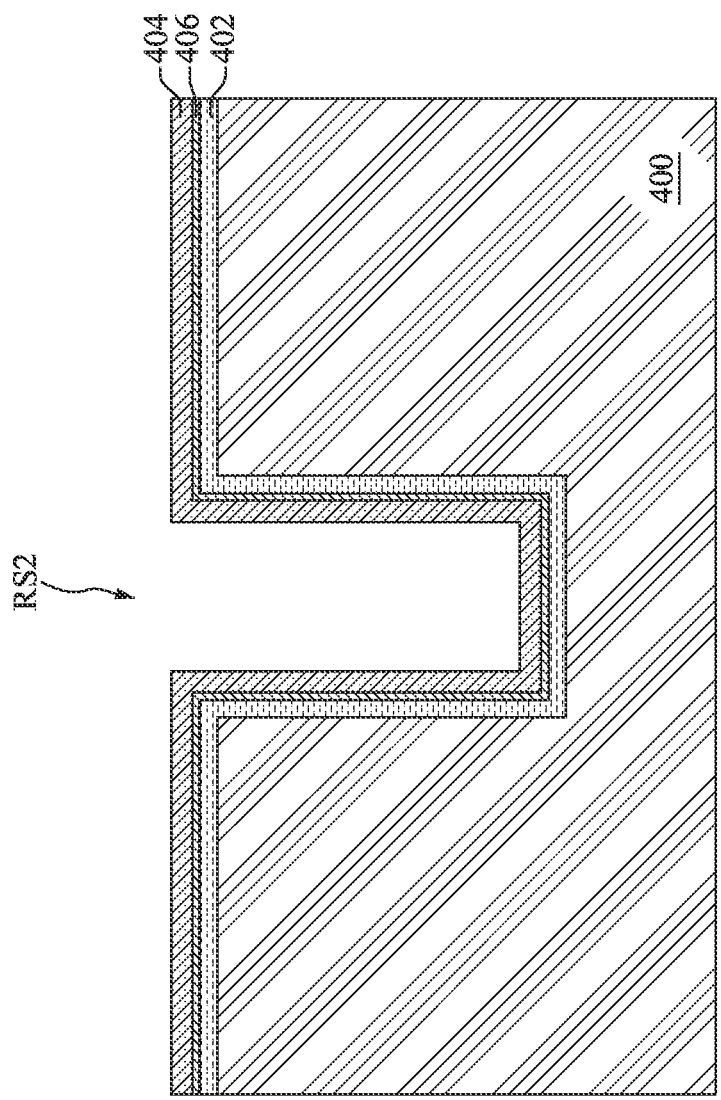

Referring to FIG. 3 and FIG. 4D, step S37 is performed, and a rapid thermal treatment is performed on the current structure. During the rapid thermal treatment, contents in the dielectric layer 402 may diffuse into a thin portion of the barrier layer 404 in contact with the dielectric layer 402, and react with contents in this thin portion of the barrier layer 404. As a result, an interfacial layer 406 may be formed long an interface between the dielectric layer 402 and the barrier layer 404. In those embodiments where the dielectric layer 402 and the barrier layer 404 both extend over the topmost surface of the substrate 400, the interfacial layer 406 extending in between also lies over the topmost surface of the substrate 400. As similar to the interfacial layer 110 as described with reference to FIG. 2E, the interfacial layer 406 may show great conformity along such interface. In addition, a thickness of the interfacial layer 406 can be controlled by a process time and a process temperature of the rapid thermal treatment. According to some embodiments, the thickness of the interfacial layer 406 is less than a thickness of the remained barrier layer 404.

In those embodiments where the dielectric layer 402 is formed of silicon oxide and the barrier layer 404 is formed of titanium nitride (TiN), oxygen from the dielectric layer 402 may diffuse into the barrier layer 404, and titanium nitride in the thin portion of the barrier layer 404 in contact with the dielectric layer 402 may be oxidized to form the interfacial layer 406 of titanium oxynitride (TiON). The TiON interfacial layer 406 may be functioned as an additional dielectric layer with a dielectric constant greater than a dielectric constant of the silicon oxide dielectric layer 402.

Figure 4E:
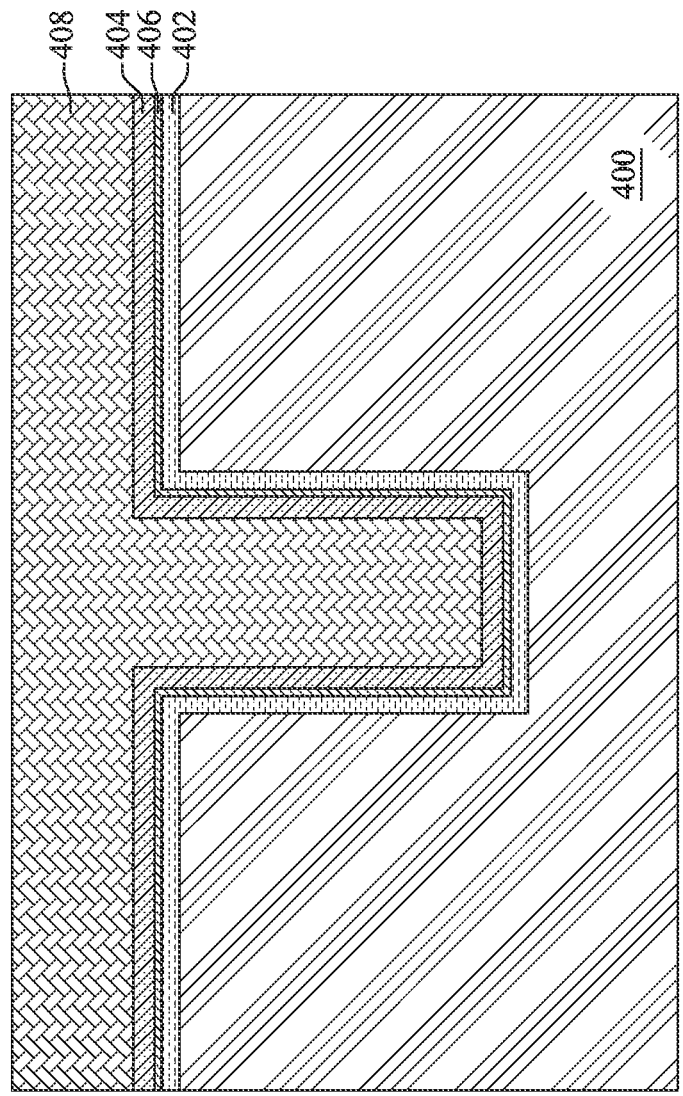

Referring to FIG. 3 and FIG. 4E, step S39 is performed, and a conductive feature 408 is filled into the recess RS2. According to some embodiments, the conductive feature 408 fills up the recess RS2, and may further span over the topmost surface of the substrate 400. In those embodiments where the dielectric layer 402, the barrier layer 404 and the interfacial layer 406 also extend over the substrate 400, portions of the conductive feature 408 over the substrate 400 are separated from the substrate 400 by the dielectric layer 402, the barrier layer 404 and the interfacial layer 406. A material of the conductive feature 408 may include tungsten, and a method for preparing the conductive feature 408 may include a deposition process, such as a CVD process.

Figure 4F:
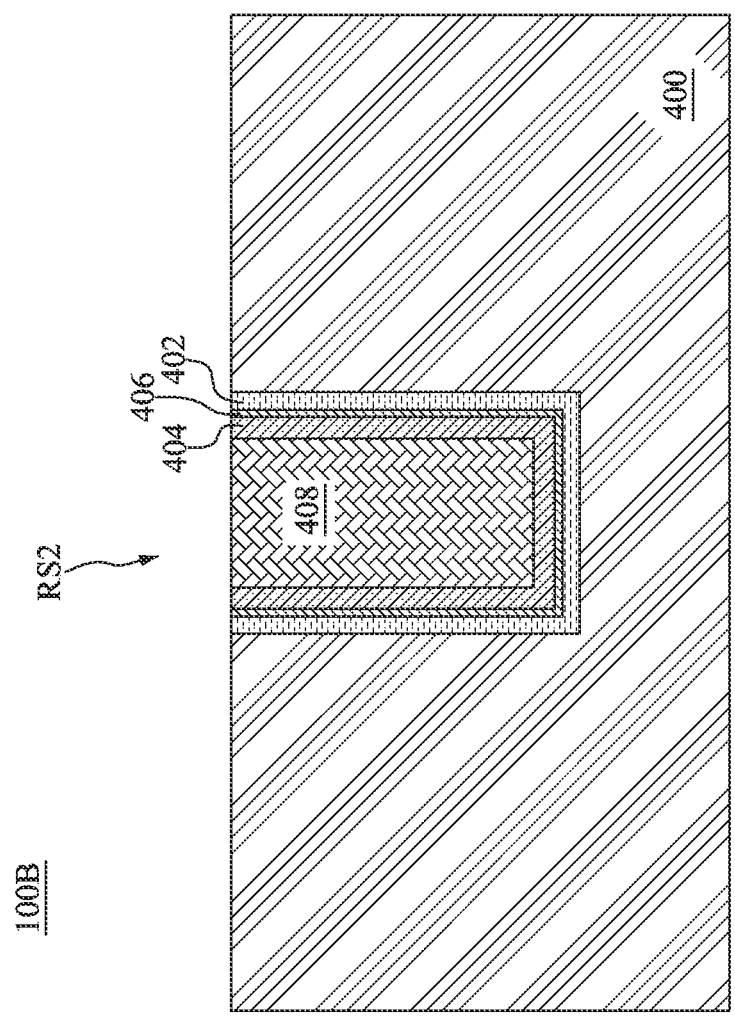

Referring to FIG. 3 and FIG. 4F, step S41 is performed, and a planarization process may be performed. During the planarization process, portions of the conductive feature 408 above the topmost surface of the substrate 400 are removed. Remained portion of the conductive feature 408 in the recess RS2 may have a top surface substantially coplanar with the topmost surface of the substrate 400. In those embodiments where the dielectric layer 402, the barrier layer 404 and the interfacial layer 406 also extend over the substrate 400, portions of the dielectric layer 402, the barrier layer 404 and the interfacial layer 406 over the substrate 400 are removed during the planarization process as well. Accordingly, top surfaces of remained portions of the dielectric layer 402, the barrier layer 404 and the interfacial layer 406 in the recess RS2 may also be substantially coplanar with the topmost surface of the substrate 400. As examples, the planarization process may include a polishing process, and etching process or a combination thereof.

So far, the conductive feature 408 is formed in the recess RS2 of the substrate 400, along with functional layers separating the conductive feature 408 from the substrate 400. These functional layers may include the dielectric layer 402, the barrier layer 404 and the interfacial layer 406 lying between the dielectric layer 402 and the barrier layer 404. Since the interfacial layer 406 is formed by diffusion and reaction occurred at the interface between the dielectric layer 402 and the barrier layer 404, the interfacial layer 406 shows great conformity along such interface. Further, a thickness of the interfacial layer 406 can be well controlled by adjusting process time and process temperature of the rapid thermal treatment resulting in the diffusion and reaction.

According to some embodiments, the conductive feature 408 is a recessed gate electrode of a field effect transistor, and capacitively coupled to the substrate 400 through the dielectric layer 402 and the interfacial layer 406. In these embodiments, the dielectric layer 402 and the interfacial layer 406 may be collectively regarded as a composite gate dielectric layer. Further, although not shown, source/drain terminals of the field effect transistor may be formed in the substrate 400 at opposite sides of the recess RS2. A thin portion of the substrate 400 extending between the source/drain terminals along a bottom surface and sidewalls of the recess RS2 may be functioned as a conduction channel of the field effect transistor. In certain cases, the conductive feature 408 and surrounding functional layers are further recessed with respect to the topmost surface of the substrate 400. Further, an insulting plug may be provided for filling up the recess RS2.

However, the conductive feature 408 is not limited to a recessed gate electrode in a field effect transistor. The conductive feature 408 can be formed in another material layer other than the substrate 400, and materials of the surrounding functional layers may be changed accordingly, as long as one of the functional layers is formed along an interface between adjacent functional layers by using the rapid thermal treatment.

As above, a method for preparing a conductive feature and conformal functional layers in a recess during manufacturing of a semiconductor device is provided. The functional layers conformally extend along sidewalls and a bottom surface of the recess, and separates the conductive feature from the recessed structure. Particularly, one of the functional layers is formed along an interface between adjacent functional layers by a rapid thermal treatment resulting diffusion across such interface and reaction taking place near the interface, and is referred to as an interfacial layer. The diffusion and reaction for forming the interfacial layer can be confined in a region close to the interface, thus the interfacial layer can have great conformity along the interface. In addition, a thickness of the interfacial layer can be controlled by process time and process temperature of the rapid thermal treatment.

In an aspect of the present disclosure, a semiconductor device is provided. The semiconductor device comprises: a recessed structure; a conductive feature, filled in a recess of the recessed structure; a first functional layer, extending between the conductive feature and the recessed structure, and comprising a first element; a second functional layer, extending between the first functional layer and the conductive feature, and comprising a second element; and an interfacial layer, extending along an interface between the first functional layer and the second functional layer, and comprising the first element and the second element.

In another aspect of the present disclosure, a manufacturing method of the semiconductor device is provided. The method comprises: forming a recessed structure; forming a first functional layer to at least cover a sidewall of a recess of the recessed structure; forming a second functional layer to cover the first functional layer; performing a rapid thermal treatment, to form an interfacial layer extending along an interface between the first functional layer and the second functional layer; and forming a conductive feature to fill up the recess.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for preparing a recessed gate structure, comprising:
   forming a recessed structure, wherein the recessed structure comprises a substrate with the recess extending into the substrate from a topmost surface of the substrate;
   forming a first functional layer to at least cover a sidewall of a recess of the recessed structure;
   forming a second functional layer to cover the first functional layer;
   performing a rapid thermal treatment to form an interfacial layer extending along an interface between the first functional layer and the second functional layer; and
   forming a conductive feature to fill up the recess;
   wherein formation of the first functional layer comprises:
     forming an initial functional layer globally and conformally covering the recessed structure; and
     removing a portion of the initial functional layer above the recessed structure and another portion of the initial functional layer extending along a bottom surface of the recess, wherein a portion of the initial functional layer remained in the recess and extending along a sidewall of the recess form the first functional layer.

2. The method of claim 1, wherein contents in the first functional layer and the second functional layer inter-diffuse across the interface between the first and second functional layers during the rapid thermal treatment for forming the interfacial layer.

3. The method of claim 1, wherein an additional interfacial layer extending along an interface between the second functional layer and a portion of the recessed structure lying below the second functional layer is further formed during the rapid thermal treatment, and the additional interfacial layer is formed as a result of inter-diffusion between the second functional layer and the portion of the recessed structure.

4. The method of claim 1, wherein oxygen in the first functional layer diffuses into a thin portion of the second functional layer in contact with the first functional layer during the rapid thermal treatment, and the thin portion of the second functional layer is oxidized to form the interfacial layer.

5. The method of claim 1, wherein forming a first functional layer includes forming a sidewall spacer laterally surrounding a lower portion of the conductive feature.

6. The method of claim 1, wherein performing the rapid thermal treatment forms the interfacial layer conformally covers the first functional layer, and extends from a bottom surface of the recess to a height lower than a topmost surface of the recessed structure.

7. The method of claim 1, wherein performing the rapid thermal treatment forms the interfacial layer including a third element in the first functional layer.

8. The method of claim 7, wherein the first functional layer is formed of silicon nitride, the second functional layer is formed of titanium, and the interfacial layer is formed of titanium silicon nitride.

9. The method of claim 1, further comprising: forming an additional interfacial layer, extending along an interface between the second functional layer and a portion of the recessed structure lying below the second functional layer.

10. The method of claim 9, wherein the additional interfacial layer is in lateral contact with the interfacial layer.

11. The method of claim 9, wherein the additional interfacial layer comprises the second element in the second functional layer and a third element in the portion of the recessed structure lying below the second functional layer.

12. The method of claim 11, wherein the second functional layer is formed of titanium, the portion of the recessed structure comprises silicon, and the additional interfacial layer is formed of titanium silicide.

13. The method of claim 5, further comprising: forming barrier layers extending between the conductive feature and the second functional layer.

14. The method of claim 1, wherein the first functional layer, the second functional layer and the interfacial layer are formed extending along a bottom surface of the conductive feature, and entirely cover a sidewall of the conductive feature.

15. The method of claim 14, wherein performing the rapid thermal treatment forms the interfacial layer including a third element in the second functional layer.

16. The method of claim 15, wherein the first functional layer is formed of silicon oxide, the second functional layer is formed of titanium nitride, and the interfacial layer is formed of titanium oxynitride.

17. The method of claim 1, wherein forming a recessed structure comprises: forming a material layer, disposed on the substrate and having a through hole, wherein a sidewall of the through hole defines a sidewall of the recess, and a portion of a top surface of the substrate overlapped with the through hole defines a bottom surface of the recess.

* * * * *